(12) United States Patent
Funada et al.

(10) Patent No.: US 7,084,493 B2
(45) Date of Patent: Aug. 1, 2006

(54) WIRING CIRCUIT BOARD AND PRODUCTION METHOD THEREOF

(75) Inventors: Yasuhito Funada, Ibaraki (JP); Tetsuya Ohsawa, Ibaraki (JP); Yasuhito Ohwaki, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 0 days.

(21) Appl. No.: 11/020,350

(22) Filed: Dec. 22, 2004

(65) Prior Publication Data

US 2005/0161775 A1 Jul. 28, 2005

(30) Foreign Application Priority Data

Dec. 22, 2003 (JP) .............................. 2003-425508

(51) Int. Cl.
*H01L 23/14* (2006.01)
*H01L 51/40* (2006.01)

(52) U.S. Cl. .................... 257/702; 257/643; 438/99

(58) Field of Classification Search .................... None
See application file for complete search history.

(56) References Cited

U.S. PATENT DOCUMENTS

| 6,117,616 A | 9/2000 | Omote et al. |
| 6,623,843 B1* | 9/2003 | Fujii et al. .................. 428/209 |
| 2002/0132095 A1* | 9/2002 | Fujii et al. .................. 428/209 |

* cited by examiner

*Primary Examiner*—David Nelms
*Assistant Examiner*—Earl Taylor
(74) *Attorney, Agent, or Firm*—Leydig, Voit & Mayer, Ltd.

(57) ABSTRACT

In the vicinity of the exposed part 1A of the multiply formed plural wiring conductors 1, of the thicknesses of the insulating cover layer 2 made of a polyimide layer, the thickness (T1) of a part located at about the middle point between the adjacent wiring conductors 1 is made smaller than the thickness (T2) of a part located on wiring conductor 1. Preferably, the difference in the thicknesses of a part located at about the middle point between the adjacent wiring conductors of the insulating cover layer 2 and that of a part located on wiring conductor is made to fall within the range of 1–5 μm. As a result, the insulating cover layer does not peel off easily.

11 Claims, 5 Drawing Sheets

WIRING CIRCUIT BOARD AND PRODUCTION METHOD THEREOF

FIELD OF THE INVENTION

The present invention relates to a wiring circuit board, particularly, a wiring circuit board that resists peeling off of an insulating cover layer, and a production method thereof.

BACKGROUND OF THE INVENTION

A structure of a mounting substrate of a semiconductor element, wherein a wiring conductor is partially exposed without covering with an insulating cover layer for use as a terminal has been generally known (e.g., JP-A-2001-156113).

In addition, a wiring circuit board using a polyimide layer for an insulating layer with the aim of achieving high-density mounting and high speed signal treatment of various electronic components is known. The polyimide layer is generally formed by applying a polyamide acid solution and drying the solution to form a polyamide acid layer, and heating the polyamide acid layer to allow for imidation.

The present inventors have considered covering a wiring conductor incompletely with an insulating cover layer (polyimide layer) in a wiring circuit board, thereby partially exposing the wiring conductor, and using the exposed part as a terminal.

However, a wiring circuit board having a structure wherein a part of a wiring conductor is exposed from an insulating cover layer has been found to suffer from easy occurrence of peeling of an insulating cover layer.

In view of the above situation, an object of the present invention is to provide a wiring circuit board that resists easy peeling of an insulating cover layer.

SUMMARY OF THE INVENTION

To achieve the above-mentioned object, the present inventors examined the cause of peeling of the insulating cover layer (polyimide layer) and found that it is caused by a shrinkage stress generated in the layer when a polyamide acid layer is imidized and conducted further studies to relieve the shrinkage stress. As a result, they have found that the above-mentioned shrinkage stress can be relieved by making the thickness of a part of a polyimide layer, which is located between wiring conductors, smaller than the thickness of a part on the wiring pattern, which resulted in the completion of the present invention.

Accordingly, the present invention has the following characteristics.

(1) A wiring circuit board having a structure wherein an insulating cover layer made of a polyimide layer is formed on plural wiring conductors multiply formed such that a part of each wiring conductor is exposed, wherein, in the vicinity of the exposed part of the wiring conductor, a part of the insulating cover layer, which is located at about the middle point between the adjacent wiring conductors, has a thickness smaller than the thickness of a part located on the wiring conductor.
(2) The wiring circuit board of the above-mentioned (1), wherein the thickness of the part located at about the middle point and the thickness of the part located on the wiring conductor are different by 1–5 µm.
(3) The wiring circuit board of the above-mentioned (1) or (2), wherein the part located at about the middle point has a thickness of not more than 4 µm.
(4) The wiring circuit board of the above-mentioned (1), wherein the exposed part of the wiring conductor is for a terminal.
(5) The wiring circuit board of the above-mentioned (1), wherein the wiring circuit board is a suspension board with a printed circuit.
(6) A method of producing a wiring circuit board of any of the above-mentioned (1) to (5), which method comprises the steps of;
forming a conductor layer patterned to include multiply formed plural wiring conductors, on a substrate at least having an insulating surface,
forming a polyamide acid layer such that plural wiring conductors are covered while exposing a part of each wiring conductor and the thickness of a part located at about the middle point between the adjacent wiring conductors is smaller than the thickness of a part located on the wiring conductor, and
heating the polyamide acid layer for imidation to form an insulating cover layer.
(7) The method of the above-mentioned (6), wherein the step of forming the polyamide acid layer comprises
applying and drying a liquid of photosensitive polyamide acid on the multiply formed wiring conductors to give a coating,
performing a pattern exposure using a gradation exposure mask, such that the amount of light on, of respective parts of the coating, a part located between the adjacent wiring conductors is smaller than the amount of light on other parts,
heating and
developing,
whereby the thickness of a part located between the adjacent wiring conductors is made smaller than the thickness of a part on the wiring conductor.
(8) The method of the above-mentioned (7), wherein the pattern exposure is performed such that a difference between the thickness of a part located at about the middle point between the adjacent wiring conductors and the thickness of a part located on the wiring conductor is 1–5 µm.
(9) The method of the above-mentioned (7) or (8), wherein the pattern exposure is performed such that the thickness of a part located at about the middle point between the adjacent wiring conductors is not more than 4 µm.

In the Figures, each symbol means as follows. 1; wiring conductor, 2; insulating cover layer (polyimide layer), 3; metal foil (substrate), 4; base insulating layer, 10; single-sided wiring circuit board.

DETAILED DESCRIPTION OF THE INVENTION

The present invention is explained in more detail in the following by referring to the Figures.

Figure 1:
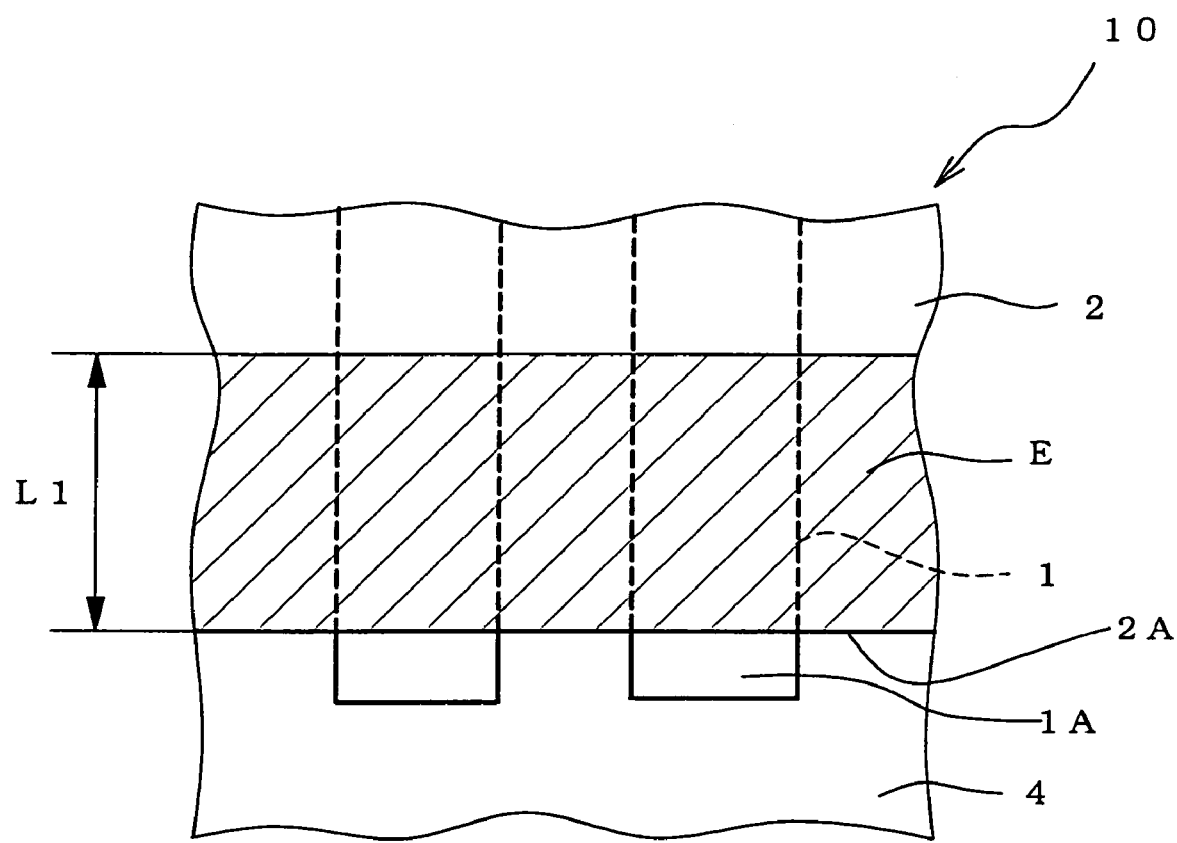
FIG. 1 is a plane view showing one embodiment of a terminal of a single-sided wiring circuit board of the present invention.
Figure 2:
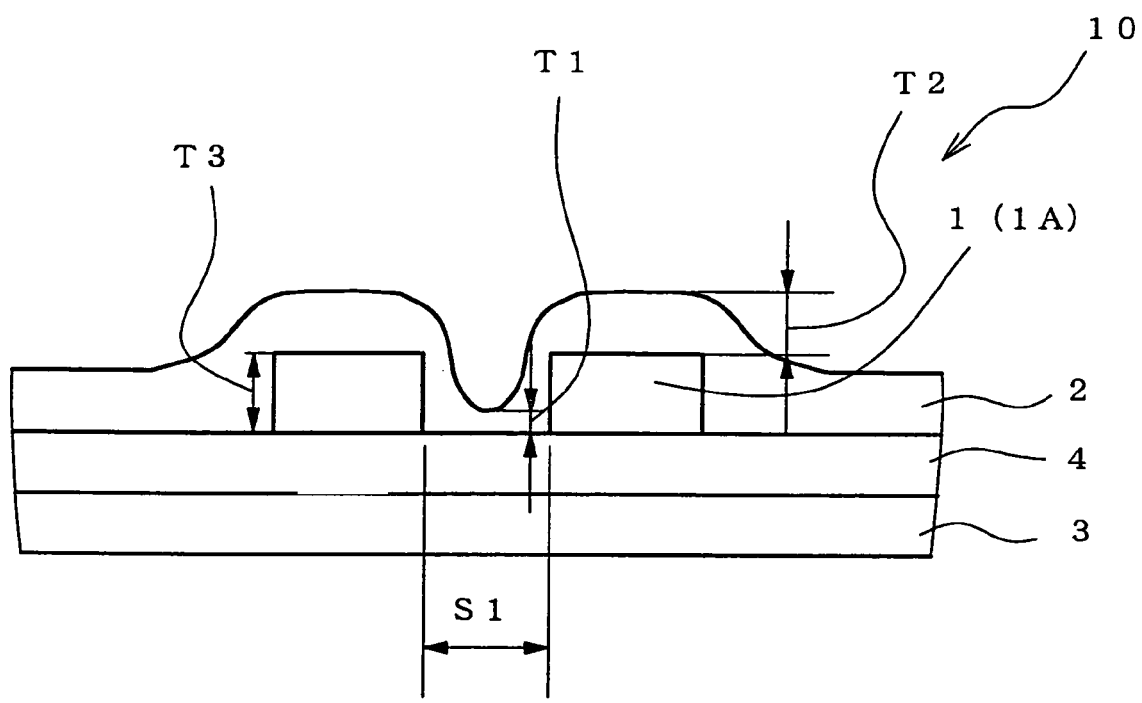
FIG. 2 is a side view showing one embodiment of a terminal of a single-sided wiring circuit board of the present invention.

FIG. 1 and FIG. 2 are a plane view and a side view of a terminal and the vicinity thereof in one embodiment of single-sided wiring circuit board of the present invention.

As shown in single-sided wiring circuit board 10 in these Figures, the wiring circuit board of the present invention has a structure comprising multiply formed plural wiring conductors 1 and an insulating cover layer 2 made of a polyimide layer, which is formed to cover these and expose a part of each wiring conductor 1, wherein at least in the vicinity of exposed part 1A of wiring conductor 1, in the thickness of the insulating cover layer (polyimide layer) 2, the thickness (T1) of an about middle point between the adjacent wiring conductors 1 is made smaller than the thickness (T2) of a part located on wiring conductor 1.

The symbol 3 in FIG. 2 of the single-sided wiring circuit board 10 exemplarily shown here is a metal foil (substrate) and the symbol 4 shows a base insulating layer.

In the vicinity of the exposed part of the multiply formed plural wiring conductors of the wiring circuit board of the present invention, of the thickness of the insulating cover layer, the thickness of a part located at about the middle point between the adjacent wiring conductors is smaller than the thickness of a part located on the wiring pattern.

The insulating cover layer having difference in the thickness does not peel off easily from the wiring conductor. The reason therefore is as follows. To be precise, when forming an insulating cover layer (polyimide layer) by heat curing (imidation) a polyamide acid layer, the shrinkage stress generated in the insulating cover layer is released and prevents degradation of the adhesion to the wiring conductor. As a result, an insulating cover layer (polyimide layer) resists peeling off from a wiring conductor during a post-processing treatment to make the outer periphery (outline) of a wiring circuit board a desired shape and actual use as a product, thus realizing a highly reliable wiring circuit board.

In the wiring circuit board in the field the present invention aims at, a polyimide layer is generally prepared by forming a layer of polyamide acid (polyamide acid layer), which is a precursor of polyimide, and imidating same by heating.

The insulating cover layer 2 made of a polyimide layer in the present invention is formed by heating a polyamide acid layer formed in the vicinity of exposed part 1A of a wiring conductor 1 such that the thickness of the part located at about the middle point between the adjacent wiring conductors 1 is smaller than a part on the wiring conductor 1, to allow for imidation.

Thus, when the thickness of a part located at about the middle point between the adjacent wiring conductors 1 of plural wiring conductors of a polyamide acid layer before imidation (before heating) is made smaller than the thickness of a part located on a wiring conductor 1, the relationship in the thickness is maintained even after imidation (after heating), and the insulating cover layer (polyimide layer) 2 to be formed has a thickness (T1) of a part located at about the middle point between the adjacent plural wiring conductors 1 becomes smaller than the thickness (T2) of a part located on the wiring conductor 1.

As mentioned above, the wiring circuit board of the present invention is formed in an embodiment of a polyamide acid layer which is a precursor of an insulating cover layer (polyimide layer) 2, wherein, in the vicinity of the exposed part 1A of the wiring conductor 1, the thickness of the part located at about the middle point between the adjacent wiring conductors 1 is smaller than the thickness of the part located on the wiring pattern.

The polyamide acid layer subject to a limitation on the thickness is heated for imidation, whereby an insulating cover layer (polyimide layer) 2 is formed. As a result, the shrinkage stress generated on the layer during imidation of the polyamide acid layer is relieved in the vicinity of the exposed part 1A of the wiring conductor 1. This provides a consequence that the adhesion of the insulating cover layer (polyimide layer) 2 to the surfaces of the sides that are present between the adjacent two conductors 1 is enhanced.

As a result, an insulating cover layer (polyimide layer) 2 resists peeling off from a wiring conductor 1 during a post-processing step thereafter to make a desired shape of the wiring circuit board and actual use as a product, thus providing a highly reliable wiring circuit board.

Thus, peeling of an insulating cover layer (polyimide layer) 2, which occurred conventionally from, as a starting point, an end 2A of insulating cover layer (polyimide layer) 2 along an exposed part 1A of a wiring conductor 1, does not occur easily.

In the present invention, the difference in the thickness (T1) of a part located at about the middle point bet the adjacent wiring conductors 1 of the insulating cover layer (polyimide layer) 2 and the thickness (T2) of a part located on the wiring conductor 1 varies depending on the thickness (T3 in FIG. 2) of the wiring conductor 1 and the size of the gap (S1 in FIG. 2) between the adjacent wiring conductors 1, generally, when the thickness of the wiring conductor 1 is about 5–20 μm and the gap between the adjacent wiring conductors 1 is about 20–200 μm, the difference is preferably 1–5 μm, more preferably 3–5 μm. Such difference in the thickness of 1–5 μm enables sufficient release of the shrinkage stress during imidation of an insulating cover layer (polyimide layer) 2, thus showing higher adhesion to the wiring conductor 1. When the difference in the thickness is less than 1 μm, the shrinkage stress during imidation of the insulating cover layer (polyimide layer) 2 is not sufficiently relieved.

In the insulating cover layer (polyimide layer) 2, moreover, while the thickness of a part located at about the middle point between the adjacent wiring conductors (T1) and the thickness (T2) of a part located on a wiring conductor are not particularly limited, the thickness (T1) is preferably not more than 4 μm, particularly preferably not more than 3 μm, from the aspect of release of the shrinkage stress. On the other hand, the thickness (T2) is preferably 3–20 μm, particularly preferably 4–7 μm, for protection the wiring conductor. When it is less than 3 μm, an edge of the wiring conductor may be unpreferably exposed, and when it exceeds 20 μm, the shrinkage stress unpreferably increases.

In the present invention, by "the vicinity of the exposed part of a wiring conductor" is meant as shown in FIG. 1, a region E from an end 2A of the insulating cover layer 2 along the exposed part 1A of the wiring conductor 1 to approximately 100 μm of the distance L1 in the axial direction of the wiring conductor 1. In the region E, when the insulating cover layer 2 is formed such that the thickness (T1) of the part located an about middle point between the adjacent wiring conductors 1 is smaller than the thickness (T2) of a part located on the wiring conductor 1, the object of the present invention can be achieved. To ensure prevention of peeling of the insulating cover layer 2, in the region exceeding the region E, the insulating cover layer 2 is preferably formed in the above-mentioned thickness relationship. The "exposed part of a wiring conductor" in the present invention generally means an exposed part of a wiring conductor to be used as an electrode and the like of a terminal, which is, for example, electrically connected to a terminal of an external apparatus (electronic component etc.).

As shown in FIG. 2, the single-sided wiring circuit board in the present invention basically comprises a metal foil (substrate) 3, a base insulating layer 4 formed on single-sided of the metal foil (substrate) 3, a wiring conductor 1 formed on the base insulating layer 4, and an insulating cover layer 2 formed on the wiring conductor 1 as constituent elements, and known constituent elements for this kind of wiring circuit board, which are other than those, may be added as necessary depending on the specific use of the wiring circuit board.

Representative examples of the single-sided wiring circuit board of the present invention include a suspension board with a printed circuit, wherein an electric circuit (wiring pattern) is formed on a suspension board (metal foil) on which to mount a head, which is used for a magnetic head (particularly, thin film magnetic head (TFH) wherein a coil part is a thin film, a thin film—magnetic reluctance compound head (MR) etc.) in a hard disk drive.

Figure 3:
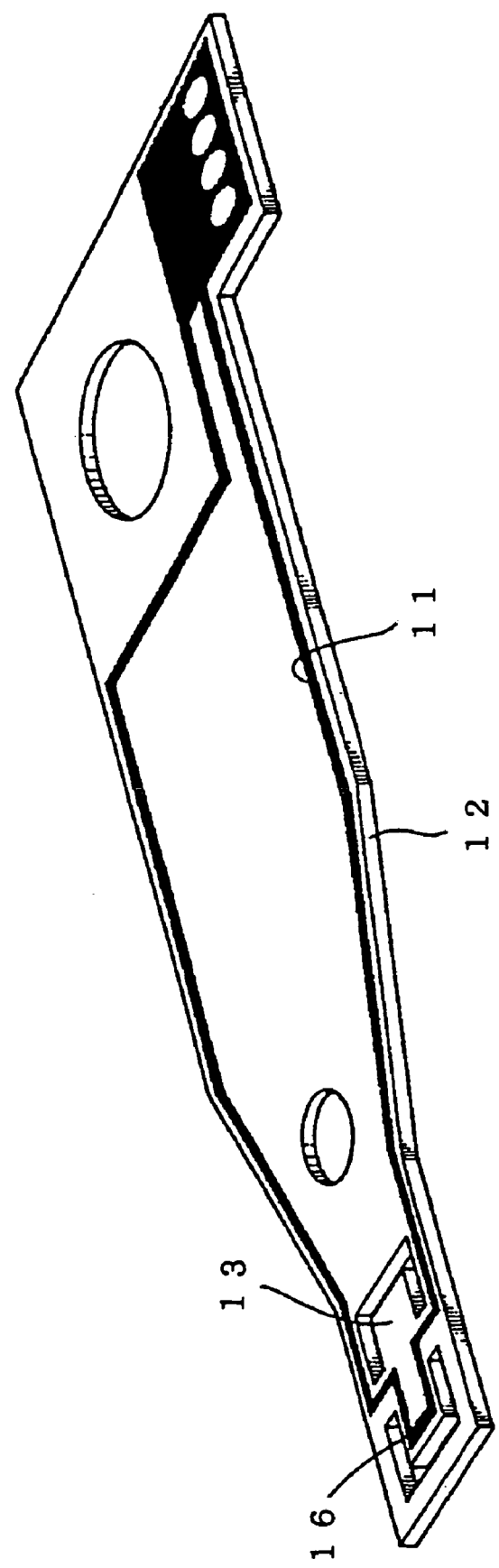
FIG. 3 is a perspective view of one embodiment of a suspension board with printed circuit of the present invention.

FIG. 3 is a perspective view showing one embodiment of the suspension board with a printed circuit, wherein a base insulating layer (not shown) made of a polyimide resin is formed on a stainless steel foil (substrate) 12, and a wiring conductor (electric circuit) 11 formed in a given pattern is formed thereon. On its tip is formed a gimbal 13 integrally with the substrate 12 by cutting into the substrate 12, whereon a slider (not shown) having a magnetic head is fixed. On one end of the wiring conductor 11 is formed a terminal 16 to connect a magnetic head, which comprises an exposed part of the wiring conductor 11.

Figure 4:
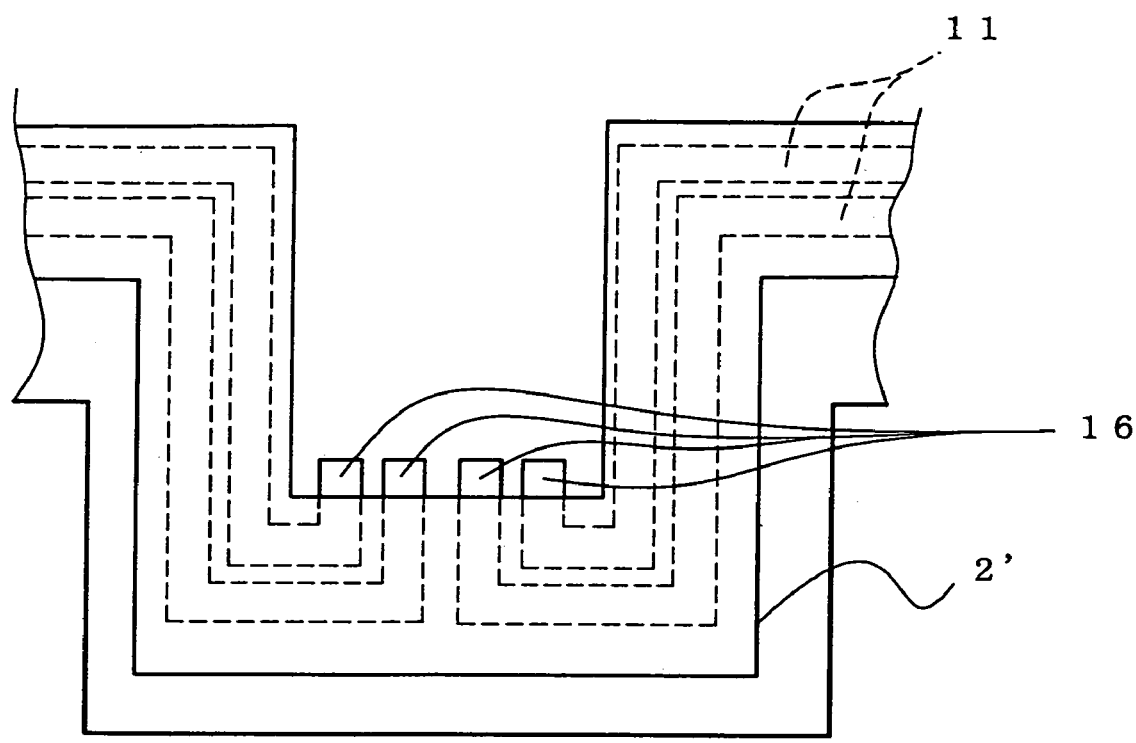
FIG. 4 is a plane view of an enlarged vicinity of terminal 16 of FIG. 3.
Figure 5:
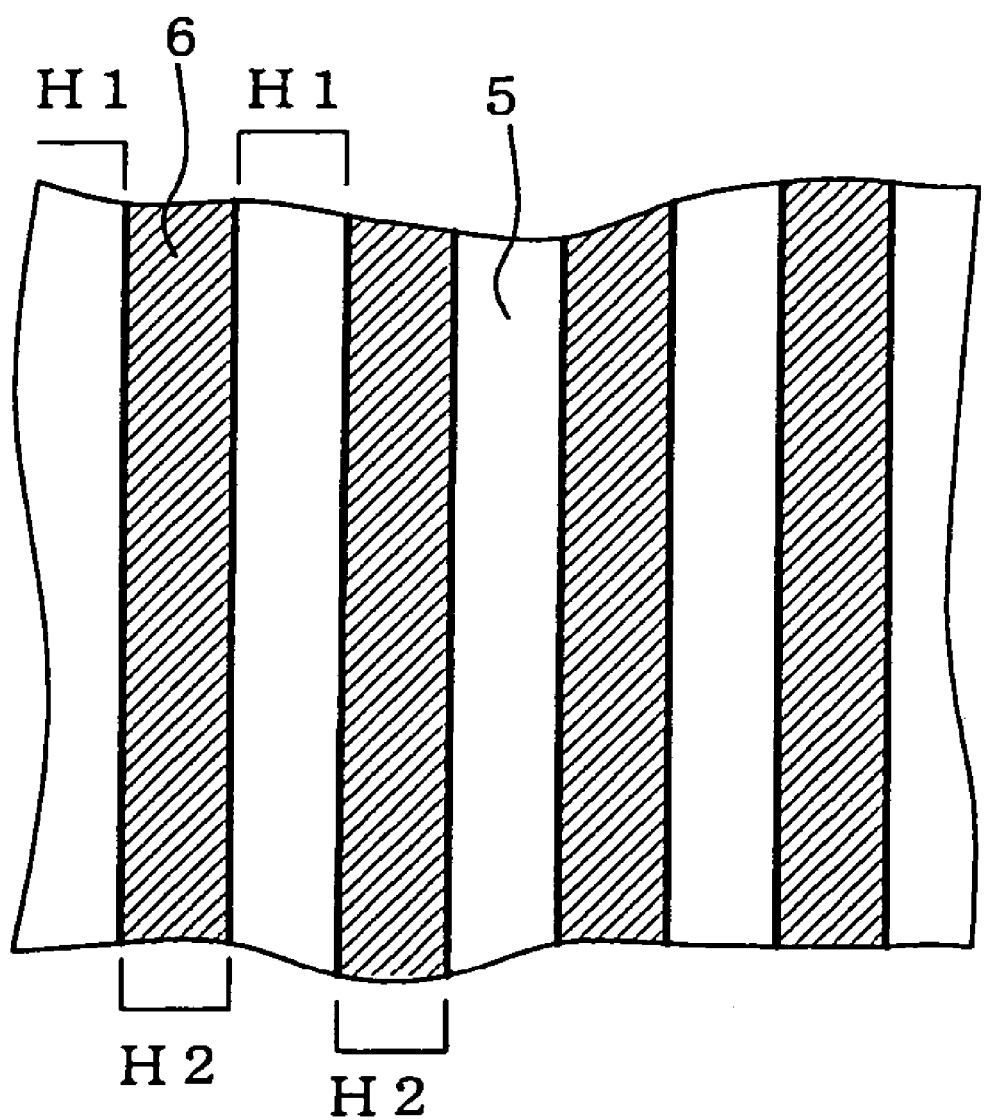
FIG. 5 is a plane view of major parts of a gradation exposure mask to be used in the present invention.

FIG. 4 is an enlarged view of the vicinity of a terminal 16 in FIG. 3. As shown in FIG. 4, wiring conductor 11の end part には, an insulating cover layer 2' is not formed but the end part is exposed to form a terminal 16.

In the vicinity of the terminal 16, the thickness (T1) of the insulating cover layer 2' located at about the middle point between the adjacent wiring conductors is made to be smaller than the thickness (T2) of the insulating cover layer 2' located on the wiring conductor 11, as a result of which the insulating cover layer 2' does not come off easily.

The present invention is applicable to not only the single-sided wiring circuit board (suspension board with printed circuit) shown in the above-mentioned embodiment but also applicable to a both side wiring circuit board and a multiple layer wiring circuit board. To be precise, in a both side wiring circuit board and a multiple layer wiring circuit board, when a structure comprising a partially exposed insulating cover layer made of a polyimide layer is formed on the multiply formed plural wiring conductors, the thickness of the insulating cover layer is made to fall within the above-mentioned thickness relationship, whereby a both side wiring circuit board and a multiple layer wiring circuit board, which do not allow easy peeling of an insulating cover layer, can be afforded.

In the wiring circuit board of the present invention, materials for known wiring circuit boards can be used without limitation for a metal foil (substrate), a base insulating layer to cover the metal foil (substrate), a wiring conductor and the like.

As the metal foil, in addition to the stainless steel foil shown in the aforementioned embodiment, as well as a copper foil, an aluminum foil, a copper—beryllium foil, a phosphor bronze foil, a 42 alloy foil and the like can be mentioned.

While the thickness of the metal foil varies depending on the specific use of the wiring circuit board, it is generally 10–30 µm.

As the base insulating layer, polyimide, polyester and the like can be mentioned. When the entire surface of single-sided of the metal foil (substrate) is not covered with a base insulating layer, but the single-sided is partially covered, photosensitive polyimide to be mentioned later is used and patterned by exposure and development is preferable from the aspect of workability, pattern size precision and the like. In the present invention, moreover, since an insulating cover layer is formed with a polyimide layer, the base insulating layer is also preferably formed with a polyimide layer in view of the adhesion to an insulating cover layer, electric reliability, heat resistance and the like.

While the thickness of the base insulating layer is not particularly limited, it is generally 5–15 µm.

The wiring conductor is a patterned conductor layer, and preferred besides the copper layer (thin film) shown in the aforementioned embodiment are layers (thin films) of copper—beryllium, phosphor bronze, 42 alloy and the like. Of these, a copper layer (thin film) is preferable in view of electric properties. The thickness (T3) of the wiring conductor is generally 5–20 µm, preferably 12–17 µm, as mentioned above.

In the wiring circuit board of the present invention, as a method for forming an insulating cover layer on the multiply formed wiring conductors, such that the thickness of a part located at about the middle point between the adjacent wiring conductors (T1) is smaller than the thickness of a part located on a wiring conductor (T2), a method for forming an insulating cover layer with photosensitive polyimide is preferable.

The photosensitive polyimide means a polyimide obtained by reacting polyamide acid (polyimide precursor) in the presence of a photosensitive material. By subjecting the photosensitive polyimide to exposure, development and then imidation by heating, an insulating cover layer having a given pattern, and the above-mentioned thickness relationship (relationship between thickness (T1) and thickness (T2)) can be formed.

For the photosensitive polyimide, known photosensitive polyamide acid (photosensitive polyimide precursor) wherein known photosensitive material is added to polyamide acid obtained from acid dianhydride and diamine can be used. As described in JP-A-7-179604, photosensitive polyamide acid containing dihydropyridine derivative as a photosensitive material is preferable because it suppresses the warp of a wiring circuit board. That is, a photosensitive polyimide precursor comprising a solution of polyamide acid obtained by reacting aromatic diamine containing (a) p-phenylenediamine and (b) 2,2'-bis(trifluoromethyl)-4,4'-diaminobiphenyl with 3,4,3',4'-biphenyltetracarboxylic dianhydride and a dihydropyridine derivative as a photosensitive material is preferable.

Such preferable photosensitive polyimide precursor is a liquid composition obtained by reacting the above-mentioned aromatic diamine and tetracarboxylic dianhydride at a substantially equimolar ratio in an appropriate organic solvent, such as N-methyl-2-pyrrolidone, dimethylacetamide and the like, to give polyamide acid (polyamic acid) and adding a photosensitive material thereto.

In the above-mentioned aromatic diamine, the proportion of p-phenylenediamine, which is component (a), is 30–70 mol %, preferably 45–55 mol %, and the proportion of 2,2'-bis(trifluoromethyl)-4,4'-diaminobiphenyl, which is component (b), is 70–30 mol %, preferably 55–45 mol %. By the use of aromatic diamine having such a composition together with 3,4,3',4'-biphenyltetracarboxylic dianhydride, thereby matching the coefficients of linear expansion of the obtained polyimide and a metal foil (substrate), the warp of the wiring circuit board can be suppressed.

Of aromatic diamines, p-phenylenediamine has an action to make the obtained polyimide resin transparent to UV light, and make a photosensitive polyimide precursor containing a photosensitive material highly sensitive to UV light. On the other hand, 2,2'-bis (trifluoromethyl)-4,4'-diaminobiphenyl has an action to increase difference in the dissolution rate of exposed part and non-exposed part in a developer when the photosensitive polyimide precursor is exposed, heated and developed. Therefore, the use of the photosensitive polyimide precursor enables accurate patterning processing, and an insulating cover layer having a different particular partial thickness (difference in thickness) desired in the present invention can be formed with good precision.

The dihydropyridine derivative as the above-mentioned photosensitive material is a compound represented by the following formula (1).

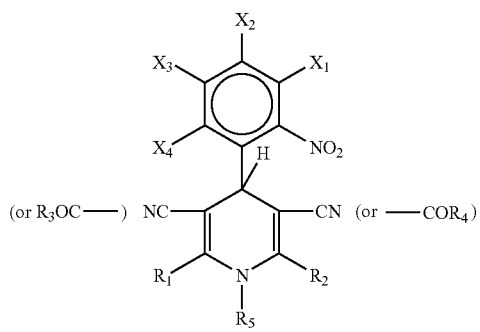

wherein R1 and R2 are each a hydrogen atoms or an alkyl group having 1 to 3 carbon atoms, R3 and R4 are each an alkyl group having 1 to 4 carbon atoms, or one kind selected from an alkoxyl group, an anilino group, a toluidino group, a benzyloxy group, an amino group and a dialkylamino group, R5 is a hydrogen atom or an alkyl group having 1 to 3 carbon atoms, X1–X4 are each one kind selected from a hydrogen atom, a fluorine atom, a nitro group, a methoxy group, a dialkylamino group, an amino group, a cyano group, alkyl fluoride group. R1 and R3, and R2 and R4 can be a ring-constituting member capable of forming a 5-membered ring, a 6-membered ring or a heterocycle, which contains a keto group.

Specific examples include 4-o-nitrophenyl-3,5-dimethoxycarbonyl-2,6-dimethyl-1,4-dihydropyridine, 4-o-nitrophenyl-3,5-dimethoxycarbonyl-2,6-dimethyl-1-methyl-4-hydropyridine (hereinafter to be referred to as an N-methyl form), 4-o-nitrophenyl-3,5-diacetyl-1,4-dihydropyridine and the like, which may be used alone or in combination of two or more kinds thereof. Where necessary, imidazole may be added as appropriate as a dissolution aid of a developer.

The above-mentioned dihydropyridine derivative is used in an amount of generally 0.05–0.5 part by mol per 1 mol of the total of aromatic diamine and aromatic tetracarboxylic dianhydride. If necessary, imidazole is also used in an amount of generally 0.05–0.5 part by mol per 1 mol of the total of diamine including aromatic diamine and aromatic tetracarboxylic dianhydride.

An insulating cover layer is formed by first applying a liquid of the above-mentioned photosensitive polyamide acid (photosensitive polyimide precursor) onto multiply formed wiring conductors and drying to give a coating. The thus-formed photosensitive polyamide acid film (layer) is exposed via a gradation exposure mask to perform pattern exposure, wherein the amount of light to a part between the adjacent wiring conductors of the multiply formed plural wiring conductors from the parts of the photosensitive polyamide acid film is smaller than the amount of light to other parts.

As used herein, by the gradation exposure mask is meant a mask partially having a pattern (FIG. 6) formed by a light transmission part H1 and a light shield part H2 formed in a stripe at a given pitch. Such mask is obtained by, for example, vapor deposition of a chromium thin film 6 in a given pattern such that a stripe pattern formed by a light transmission part H1 and a light shield part H2 shown in FIG. 6 is partially formed on a silica glass board 5. The light transmittance of a light transmission part H1 free of a chromium thin film 6 is about 100% and that of a light shield part H2 having a chromium thin film 6 is about 0%. Therefore, by adjusting the area ratio of these two, the light transmittance of the stripe pattern can be controlled. In FIG. 6, the area ratio of the light transmission part H1 and the light shield part H2 is set to 50%/50% to achieve a light transmittance of 50%.

After the pattern exposure of the photosensitive polyamide acid film (layer) using a gradation exposure mask, the photosensitive polyamide acid film (layer) is heated at a temperature of 120–180° C. for about 2–10 min, and then the film is developed. As a result, a non-exposed part is removed by a developer solution, and the exposed part remains to form a pattern, thus affording a negative pattern. Since pattern exposure using a gradation exposure mask is performed, the thickness of a part (50% exposed part) located between the adjacent wiring conductors becomes smaller than the thickness of a part (100% exposed part) located on the wiring conductor.

The pattern of the thus-obtained photosensitive polyamide acid film is heated (cured by heating) to give an insulating cover layer 2 made of a polyimide layer, wherein the thickness (T1) of a part located at about the middle point between the adjacent wiring conductors 1 is smaller than the thickness (T2) of a part located on the wiring conductor 1, as shown in FIG. 2, is formed.

As the above-mentioned developer solution, organic aqueous alkali solution such as hydroxidetetramethylammonium and the like, inorganic aqueous alkali solution such as sodium hydroxide, potassium hydroxide and the like are generally used. The alkali concentration is generally 2–5 wt %. Where necessary, the aqueous alkali solution may contain lower aliphatic alcohol such as methanol, ethanol, n-propanol, isopropanol and the like. The amount of alcohol to be added is generally not more than 50 wt %. In addition, a temperature within the range of 25–50° C. is suitable for the development.

EXAMPLES

The present invention is explained in more detail by referring to Examples.

Example 1 p-Phenylenediamine (4.55 mol) and 2,2'-bis (trifluoromethyl)-4,4'-diaminobiphenyl (1.95 mol) (total of diamine component 6.5 mol), and 3,4,3',4'-biphenyltetracarboxylic dianhydride (diphthalic dianhydride) (6.5 mol) were dissolved in N-methyl-2-pyrrolidone (7.65 kg) and the mixture was stirred at room temperature for 24 hrs. The mixture was heated to 75° C., and when the viscosity reached 5000 centipoise, heating was stopped and the mixture was allowed to cool to room temperature. Then, N-methyl form (1.2 mol) was added thereto to give a solution of a photosensitive polyimide resin precursor.

The above-mentioned solution of the photosensitive polyimide resin precursor was coated longitudinally to a stainless steel (SUS 304) foil having a thickness of 25 µm with a continuous coater, and the foil was dried by heating at 120° C. for 2 min. to form a coating of a photosensitive polyimide resin precursor. Then, UV light was irradiated at an exposure amount of 700 mJ/cm$^2$ via a mask, and the coating was heated at 160° C. for 3 min, developed to give negative images, and heated to 400° C. under vacuum at 0.01 torr to give a base insulating layer (film thickness 6 µm) comprising a patterned polyimide resin.

Then, a thin film of each of chromium and copper was formed in a film thickness of 500 angstrom and 1000 angstrom, respectively, on the thus-formed base insulating layer made of polyimide by continuous sputtering. The surface resistance of the copper thin film was 0.3–0.4 Ω/□.

On the back of the stainless steel substrate was adhered a light pressure-sensitive adhesive sheet as a plate mask, and the entire surface of the above-mentioned copper thin film was subjected to electroless plating of copper sulfate to form a copper-plated conductor layer having a film thickness of 10 µm.

Thereafter, a commercially available dry film laminate was applied onto the on the conductor layer at 110° C. according to conventional methods, exposed to light at an exposure amount of 80 mJ/cm$^2$, and developed for alkali etching of the copper conductor layer of the non-patterned parts. The conductor layer was patterned to leave a lead of the electrolytic plating along with the part to be a wiring conductor, after which resist was removed.

The stainless steel foil after the above treatment was immersed in a mixed aqueous solution of potassium ferricyanide and sodium hydroxide at 25° C. to remove unnecessary aforementioned chromium thin film. Then, conventional electroless plating was applied to form a nickel thin film having a film thickness of about 0.5 µm on the entire surface of the stainless steel foil including a conductor layer (wiring conductor) and a base insulating layer.

In the same manner as in the above, a necessary coating layer (insulating cover layer) was formed using a photosensitive polyimide resin precursor on the wiring conductor of the conductor layer the stainless steel foil. At this time, in the vicinity of the part (terminal) exposed as a terminal of the multiply formed plural wiring conductors, the thickness of the insulating cover layer between the adjacent wiring conductors was reduced from the thickness of the insulating cover layer of other parts (i.e., a part located on the wiring conductors), using the aforementioned gradation exposure mask (total width of adjacent light transmission part H1 and light shield part H2 in stripe pattern: 6 µm). The thickness of a part in the middle of the adjacent wiring conductor insulating cover layers was 2 µm and the thickness of a part on the wiring conductors was 7 µm. Then, the substrate was immerse in a nitric acid release agent at room temperature to remove the aforementioned electroless plating thin film on the terminal and stainless steel foil.

According to conventional methods, the exposed part (terminal) of the wiring conductor was removed and covered with a conventional photoresist. The exposed part (terminal) of the wiring conductor was subjected to sequential electrolytic plating with nickel and gold to form a plating layer having a thickness of 1 µm each to give a terminal. The above-mentioned resist was peeled off and to remove the lead used for plating from the conductor layer copper alkali etching and chromium etching were applied by a method similar to the aforementioned method.

According to conventional methods, exposure and development were performed using a photoresist (dry film laminate may be also employed) to form a necessary pattern on the stainless steel foil, and a stainless steel foil substrate was cut into a necessary shape by immersing in an iron (II) chloride solution at 45° C. This was sufficiently washed with pure water and dried to give individually cut suspension board with a printed circuit (FIG. 3).

The obtained suspension board with printed circuit was free of peeling off of an insulating cover layer from the wiring pattern in the vicinity of the terminal.

Comparative Example 1

In Example 1, a suspension board with printed circuit was prepared without using a gradation exposure mask. The thickness of the insulating cover layer was 7 µm both in the middle of the adjacent wiring conductors and on the wiring conductors, and the insulating cover layer was peeled off from the wiring conductor in the vicinity of the terminal.

This application is based on application No. 2003-425508 filed in Japan, the contents of which are incorporated hereinto by reference.

What is claimed is:

1. A wiring circuit board having a structure wherein an insulating cover layer made of a polyimide layer is formed on plural wiring conductors multiply formed such that a part of each wiring conductor is exposed,
   wherein, in the vicinity of the exposed part of the wiring conductor, a part of the insulating cover layer, which is located at about the middle point between the adjacent wiring conductors, has a thickness smaller than the thickness of a part located on the wiring conductor.

2. The wiring circuit board of claim 1, wherein the thickness of the part located at about the middle point and the thickness of the part located on the wiring conductor are different by 1–5 µm.

3. The wiring circuit board of claim 1, wherein the part located at about the middle point has a thickness of not more than 4 µm.

4. The wiring circuit board of claim 1, wherein the exposed part of the wiring conductor is for a terminal.

5. The wiring circuit board of claim 1, wherein the wiring circuit board is a suspension board with a printed circuit.

6. A method of producing a wiring circuit board of claim 1, which method comprises the steps of;

forming a conductor layer patterned to include multiply formed plural wiring conductors, on a substrate at least having an insulating surface, forming a polyamide acid layer such that plural wiring conductors are covered while exposing a part of each wiring conductor and the thickness of a part located at about the middle point between the adjacent wiring conductors is smaller than the thickness of a part located on the wiring conductor, and heating the polyamide acid layer for imidation to form an insulating cover layer.

7. The method of claim 6, wherein the step of forming the polyamide acid layer comprises applying and drying a liquid of photosensitive polyamide acid on the multiply formed wiring conductors to give a coating, performing a pattern exposure using a gradation exposure mask, such that the amount of light on, of respective parts of the coating, a part located between the adjacent wiring conductors is smaller than the amount of light on other parts, heating and developing, whereby the thickness of a part located between the adjacent wiring conductors is made smaller than the thickness of a part on the wiring conductor.

8. The method of claim 7, wherein the pattern exposure is performed such that a difference between the thickness of a part located at about the middle point between the adjacent wiring conductors and the thickness of a part located on the wiring conductor is 1–5 µm.

9. The method of claim 7, wherein the pattern exposure is performed such that the thickness of a part located at about the middle point between the adjacent wiring conductors is not more than 4 µm.

10. The method of claim 8, wherein the pattern exposure is performed such that the thickness of a part located at about the middle point between the adjacent wiring conductors is not more than 4 µm.

11. The wiring circuit board of claim 2, wherein the part located at about the middle point has a thickness of not more than 4 µm.

* * * * *